(12) United States Patent
Lee et al.

(10) Patent No.: US 8,257,905 B2
(45) Date of Patent: Sep. 4, 2012

(54) METHOD OF FABRICATING THIN FILM TRANSISTOR SUBSTRATE AND NEGATIVE PHOTORESIST COMPOSITION USED THEREIN

(75) Inventors: Yeong-Beom Lee, Hwaseong-si (KR); Hi-Kuk Lee, Yongin-si (KR); Byung-Uk Kim, Hwaseong-si (KR); Hyoc-Min Youn, Hwaseong-si (KR); Ki-Hyuk Koo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 343 days.

(21) Appl. No.: 12/685,545

(22) Filed: Jan. 11, 2010

(65) Prior Publication Data

US 2010/0203449 A1 Aug. 12, 2010

(30) Foreign Application Priority Data

Feb. 11, 2009 (KR) .................. 10-2009-0011081

(51) Int. Cl.
*G03F 7/004* (2006.01)
*G03F 7/30* (2006.01)
(52) U.S. Cl. ............... 430/270.1; 430/313; 430/318; 430/325; 430/920; 430/922
(58) Field of Classification Search ............... 430/270.1, 430/313, 318, 325, 920, 922
See application file for complete search history.

(56) References Cited

U.S. PATENT DOCUMENTS

| | | | | |
|---|---|---|---|---|
| 4,371,605 A | * | 2/1983 | Renner | 430/280.1 |
| 6,004,724 A | * | 12/1999 | Yamato et al. | 430/281.1 |
| 7,226,721 B2 | * | 6/2007 | Takei et al. | 430/271.1 |
| 2008/0038678 A1 | * | 2/2008 | Kishioka et al. | 430/327 |

FOREIGN PATENT DOCUMENTS

| JP | 11-258798 | 9/1999 |
|---|---|---|
| JP | 2000-330282 A | 11/2000 |
| JP | 2004-251985 A | 9/2004 |
| JP | 2007-328090 A | 12/2007 |

\* cited by examiner

*Primary Examiner* — John Chu
(74) *Attorney, Agent, or Firm* — Innovation Counsel LLP (57) ABSTRACT

A method of fabricating a thin film transistor substrate and a negative photoresist composition used therein are provided, which can reduce pattern inferiority. The method of fabricating a thin film transistor substrate includes forming a conductive film composed of a conductive material on a substrate, forming an etch pattern composed of a negative photoresist composition on the conductive film, and forming a conductive pattern by etching the conductive film using the etch pattern as an etching mask, wherein the negative photoresist composition includes 10-50 parts by weight of novolak resin including a hydroxyl group that is soluble in an alkali developing solution, 0.5-10 parts by weight of a first photo acid generator represented by the following formula (1), 0.5-10 parts by weight of a second photo acid generator represented by the following formula (2), 1-20 parts by weight of a crosslinking agent, and 10-90 parts by weight of a solvent:

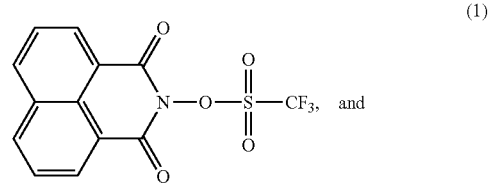

(1)

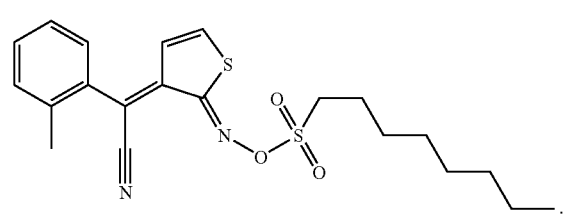

(2)

18 Claims, 9 Drawing Sheets

METHOD OF FABRICATING THIN FILM TRANSISTOR SUBSTRATE AND NEGATIVE PHOTORESIST COMPOSITION USED THEREIN

CROSS-REFERENCE TO RELATED APPLICATION

This application is based on and claims priority from Korean Patent Application No. 10-2009-0011081, filed on Feb. 11, 2009, in the Korean Intellectual Property Office, the disclosure of which is incorporated by reference herein in its entirety.

BACKGROUND OF THE INVENTION

1. Field of the Invention

The present invention relates to a method of fabricating a thin film transistor substrate and a negative photoresist composition used therein, and more particularly to a method of fabricating a thin film transistor substrate and a negative photoresist composition used therein, which can reduce pattern inferiority.

2. Description of the Prior Art

A thin film transistor substrate includes a plurality of electrode patterns and insulating layer patterns. The electrode patterns of the thin film transistor substrate are formed in a manner that a conductive film is formed on an insulating substrate, photoresist is formed on the conductive film to be patterned, and then the conductive film is patterned by using the patterned photoresist as a mask.

As a conventional photoresist, positive photoresist has been used. However, if the photoresist is formed thick or an inflow of particles occurs, the development performance of the photoresist deteriorates and the patterns become inferior.

In particular, if the electrode patterns of the thin film transistor substrate are fine patterns, the development performance of the photoresist deteriorates, and this causes the electrode patterns to be open or short-circuited. Accordingly, a method using negative photoresist instead of the positive photoresist has been researched.

However, the negative photoresist requires a post exposure banking (PEB) process.

With the trend moving toward a large-scale thin film transistor substrate, there is an increasing need for the heat resistance and uniformity of negative photoresists.

SUMMARY OF THE INVENTION

Accordingly, the present invention has been made to solve the above-mentioned problems, and an object of the present invention is to provide a method of fabricating a thin film transistor substrate that can reduce the pattern inferiority.

Another object of the present invention is to provide a negative photoresist composition that has an improved heat-resistance and uniformity.

Additional advantages, objects, and features of the invention will be set forth in part in the description which follows and in part will become apparent to those having ordinary skill in the art upon examination of the following or may be learned from practice of the invention.

In order to accomplish these objects, there is provided a method of fabricating a thin film transistor substrate, according to an embodiment of the present invention, which includes forming a conductive film composed of a conductive material on a substrate; forming an etch pattern composed of a negative photoresist composition on the conductive film; and forming a conductive pattern by etching the conductive film using the etch pattern as an etching mask; wherein the negative photoresist composition includes 10-50 parts by weight of novolak resin including a hydroxyl group that is soluble in an alkali developing solution, 0.5-10 parts by weight of a first photo acid generator represented by the following formula (1), 0.5-10 parts by weight of a second photo acid generator represented by the following formula (2), 1-20 parts by weight of a cross-linking agent, and 10-90 parts by weight of a solvent:

(1)

(2)

In another aspect of the present invention, there is provided a negative photoresist composition, which includes 10-50 parts by weight of novolak resin containing a hydroxyl group that is soluble in an alkali developing solution; 0.5-10 parts by weight of a first photo acid generator represented by the following formula (1); 0.5-10 parts by weight of a second photo acid generator represented by the following formula (2); 1-20 parts by weight of a cross-linking agent; and 10-90 parts by weight of a solvent:

(1)

(2)

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element. By contrast, the term "directly on" means that an element is directly on another element or a layer without intervention of any other element or layer. In the entire description of the present invention, the same drawing reference numerals are used for the same elements across various figures. Also, the term "and/or" includes the respective described items and combinations thereof.

Spatially relative wordings "below", "beneath", "lower", "above", "upper", and so forth, as illustrated in the drawings, may be used to facilitate the description of relationships between an element or constituent elements and another element or other constituent element. The spatially relative wordings should be understood as wordings that include different directions of the element in use or operation in addition to the direction illustrated in the drawings.

In the following description of the present invention, embodiments of the present invention will be described with reference to plane views and sectional views which are ideal schematic views. The form of exemplary views may be modified due to the manufacturing techniques and/or allowable errors. Accordingly, the embodiments of the present invention are not limited to their specified form as illustrated, but include changes in form being produced according to manufacturing processes. Accordingly, areas exemplified in the drawings have rough properties, and the shapes of areas in the drawings are to exemplify specified forms of areas of elements, but do not limit the scope of the present invention.

Hereinafter, with reference to FIGS. 1 to 11, a method of fabricating a thin film transistor substrate according to a first embodiment of the present invention will be described in detail.

Figure 1:
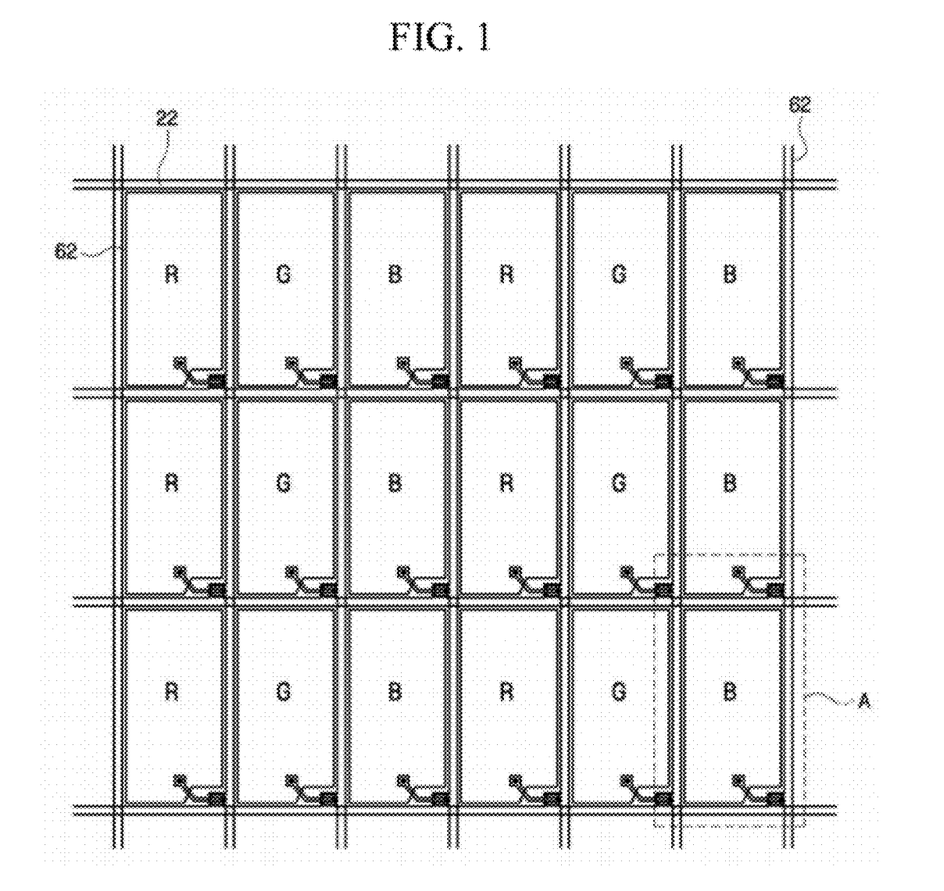
FIG. 1 is a layout diagram of a thin film transistor substrate fabricated by a method according to a first embodiment of the present invention.
Figure 2:
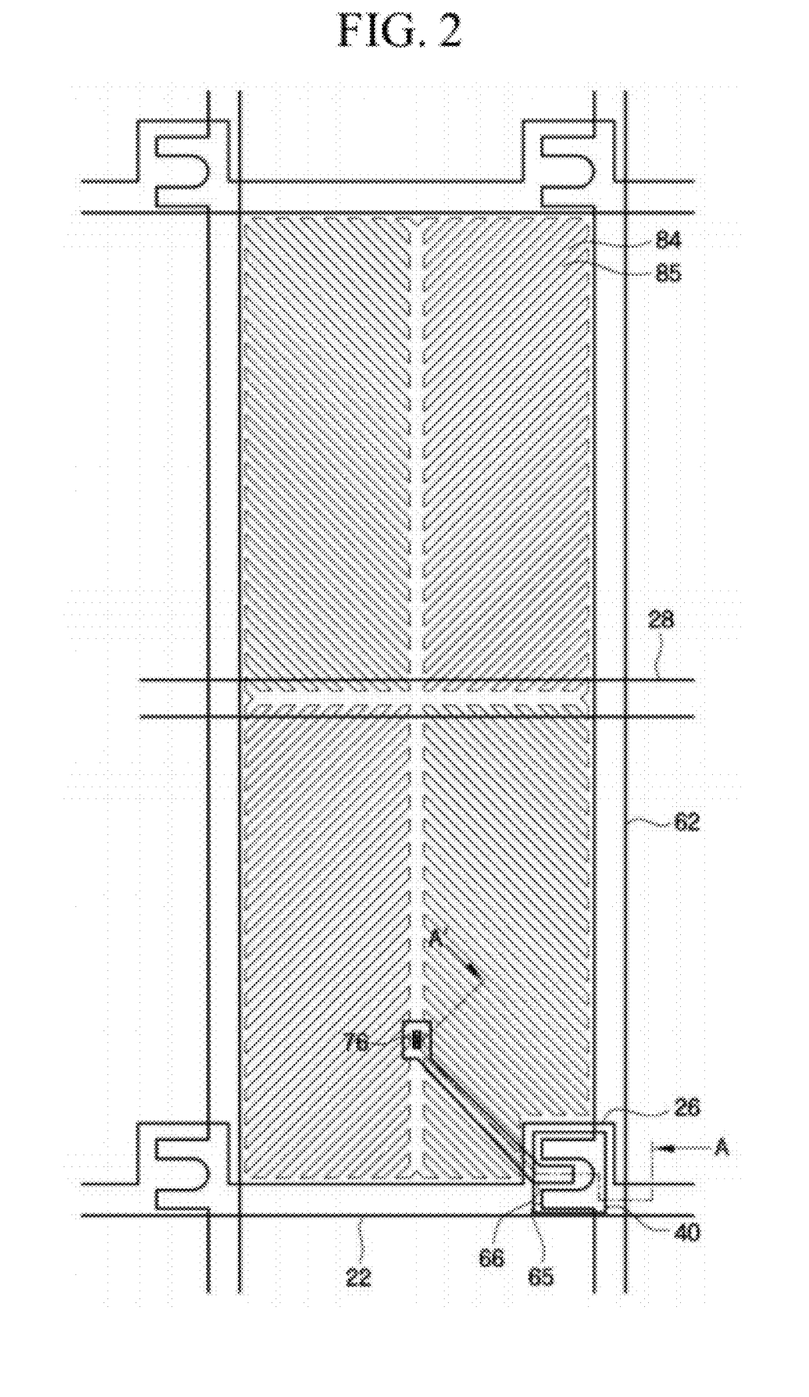
FIG. 2 is an enlarged view of a part "A" in FIG. 1.
Figure 3:
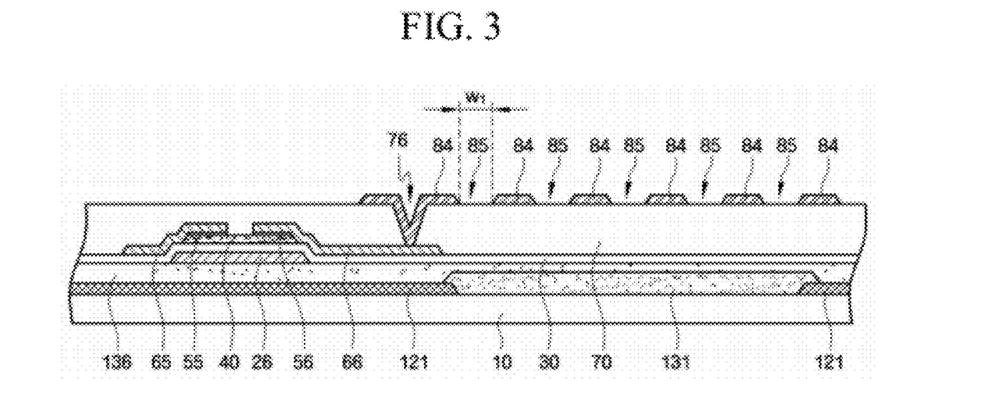
FIG. 3 is a sectional view taken along line A-A' in FIG. 2.

FIG. 1 is a layout diagram of a thin film transistor substrate fabricated by a method according to a first embodiment of the present invention, FIG. 2 is an enlarged view of a part "A" in FIG. 1, and FIG. 3 is a sectional view taken along line A-A' in FIG. 2. FIGS. 4 to 11 are sectional views illustrating in order processes of a method of fabricating a thin film transistor substrate according to the first embodiment of the present invention.

First, referring to FIGS. 1 to 3, the thin film transistor substrate fabricated according to the first embodiment of the present invention includes a plurality of pixels arranged in the form of a matrix, and a plurality of thin film transistors provided for the respective pixels. A plurality of gate wires 22 extend along boundaries of the pixels in a row direction, and a plurality of data wires 62 extend along boundaries of the pixels in a column direction. In an area where the gate wire 22 crosses the data wire 62, a thin film transistor including a gate electrode 24, a source electrode 65, and a drain electrode 66 is formed.

The thin film transistor substrate according to the embodiment of the present invention may have an AOC (Array On Color filter) structure in which color filters 131 are formed on an insulating substrate 10 and a thin film transistor array such as the gate wires is formed on the color filters 131, or a COA (Color filter On Array) structure in which color filters 131 are formed on a thin film transistor array. However, the structure of the thin film transistor substrate is not limited thereto. Hereinafter, the thin film transistor substrate having the AOC structure will be described as an example.

According to the thin film transistor substrate having the AOC structure, black matrices 121 are formed on the insulating substrate 10. In a pixel area between the black matrices 121, red, green, and blue color filters 131 are successively arranged. On the color filters 131, an overcoat layer 136 for smoothing the unevenness of the color filters is formed.

On the overcoat layer 136, a gate wire and a data wire are formed. The gate wire includes a gate line 22, a gate electrode 26, and a storage wire 28, and the data wire includes a gate insulating layer 30, a semiconductor layer 40, ohmic contact layers 55 and 56, a data line 62, a source electrode 65, and a drain electrode 66. A passivation layer 70 having a contact hole 76 is formed on an upper part of the data wire, and pixel electrode patterns 84 and 85 are arranged on an upper part of the passivation layer 70.

The pixel electrode patterns 84 and 85 are made of a transparent conductive material, such as ITO (Indium Tin Oxide) or IZO (Indium Zinc Oxide). In the embodiment of the present invention, the pixel electrode patterns 84 and 85 are composed of a plurality of fine electrodes 84 and a plurality of fine slits 85 formed among the fine electrodes 84. Specifically, the pixel electrode patterns 84 and 85 according to the embodiment of the present invention are composed of a cross-shaped main frame dividing a pixel area into four equal parts, a plurality of fine electrodes 84 formed, for example, in a tilt direction that is directed from the main frame to an outside part of the pixel area, and a plurality of fine slits 85 arranged among the plurality of fine electrodes 84. The fine electrodes 84 formed in the tilt direction is substantially at an angle of 45° to a permeated axis of a polarization plate to be described later. That is, the fine electrodes 84 are formed in four different directions from the center of the pixel area as they are substantially at an angle of 45° to the permeated axis of the polarization plate. Accordingly, when an electric power is applied to a liquid crystal display, liquid crystals (not illustrated) are aligned in four different directions.

The width of the fine electrodes 84 in the center part of the pixel electrode patterns 84 and 85, i.e., in a part where the fine electrodes 84 contact the cross-shaped main frame, may be equal to or differ from the width of the fine electrodes 84 in the outer part of the pixel area. In the case where the widths of the fine electrodes 84 are equal over the whole pixel area, a width w1 of the fine slits 85 may be in the range of 2 to 5 µm. Although not illustrated in the drawing, a common electrode substrate arranged on an upper part of the thin film transistor substrate according to the embodiment of the present invention may include a non-patterned common electrode. Accordingly, if the pixel electrode patterns 84 and 85 adjust the alignment of the liquid crystals (not illustrated) and the width w1 of the fine slits 85 exceeds 5 µm, the response speed of the liquid crystals (not illustrated) may be lowered. Also, due to the limitation of resolution of an exposure system, it may be difficult to adjust the width w1 of the fine slits 85 under 2 µm.

Figure 4:
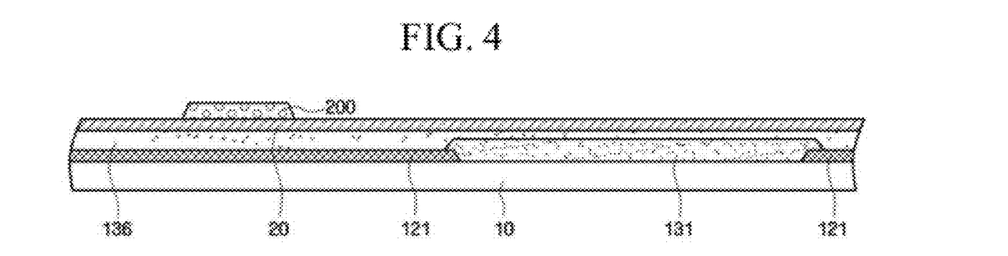
FIGS. 4 to 11 are sectional views illustrating in order processes of a method of fabricating a thin film transistor substrate according to the first embodiment of the present invention.
Figure 11:
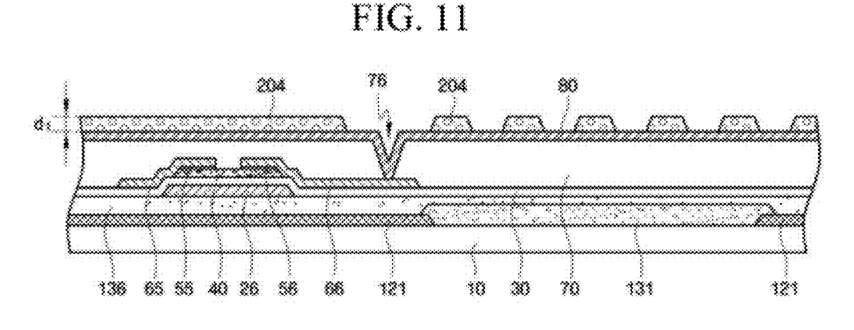

Referring to FIGS. 4 and 11, processes of fabricating the thin film transistor substrate will be described.

First, the insulating substrate 10 is prepared. The insulating substrate may be made of glass, such as soda lime glass and borosilicate glass, or plastic, such as polyethersulfone and polycarbonate. Also, the insulating substrate 10 may be a flexible substrate made of polyimide.

The insulating substrate 10 may have a size corresponding to a unit thin film transistor substrate used in a liquid crystal display, or may be a large-scale substrate for providing a plurality of thin film transistor substrates. Here, the large-scale substrate means a substrate having vertical and horizontal lengths of 2 m or more. As the insulating substrate 10 becomes larger in size, the thermal stability and development uniformity of the photoresist patterns used in etching are greatly required. This feature will be further described later.

Then, on the insulating substrate 10, black matrices 121 are formed by depositing an opaque material such as chrome (Cr), chrome oxide ($CrO_x$), and the like, and patterning the deposited material. Red, green, and blue color filters 131 are formed by spreading, for example, photoresist on an upper part of the black matrices 121 and on a front surface of the insulating substrate 10 exposed by the black matrices 121, and then exposing and developing the spread photoresist. Next, the overcoat layer 136 is formed on the black matrices 121 and the color filters 131.

Thereafter, the gate wire, which includes the gate line 22, the gate electrode 26, and the storage wire 28, is formed on the overcoat layer 136 by laminating the conductive layer 20 for the gate wire on the overcoat layer 136 and then patterning the laminated conductive layer 20. A negative photoresist composition according to the second embodiment of the present invention may be used as a photoresist pattern 200 used to form the gate wire. Detailed description of the photoresist pattern 200 will be made later.

Here, in order to form the gate wire including the gate line 22, the gate electrode 26, and the storage wire 28, the conductive layer 20 may be formed by sputtering. The sputtering is performed in a low-temperature process below 200° C. in one example. Then, the photoresist pattern 200 is formed on the conductive layer 20, and the conductive layer 20 is patterned by wet etching or dry etching using the photoresist pattern 200 as an etching mask. In the case of the wet etching, an etching solution, such as phosphate, nitrate, acetate, and the like, is used.

The gate wire may be made of aluminum series metal such as aluminum (Al) and aluminum alloys, silver series metal such as silver (Ag) and silver alloys, copper series metal such as copper (Cu) and copper alloys, molybdenum series metal such as molybdenum (Mo) and molybdenum alloys, chrome (Cr), titanium (Ti), tantalum (Ta), and the like. Also, the gate wire may have a multilayer structure that includes two conductive layers (not illustrated) having different physical properties. One of the conductive layers is made of metal having low resistivity, e.g. aluminum series metal, silver series metal, copper series metal, and the like, so as to reduce signal delay or voltage drop of the gate wire. Unlike this, the other of the conductive layers is made of a material having superior contact characteristics with zinc oxide (ZnO), ITO, and IZO, such as molybdenum series metal, chrome (Cr), titanium (Ti), tantalum (Ta), and the like. A chrome lower layer and an aluminum upper layer, and an aluminum lower layer and a molybdenum upper layer may be good examples of such combinations. However, the present invention is not limited thereto, and the gate wire may be formed of diverse kinds of metals and conductors.

Figure 5:
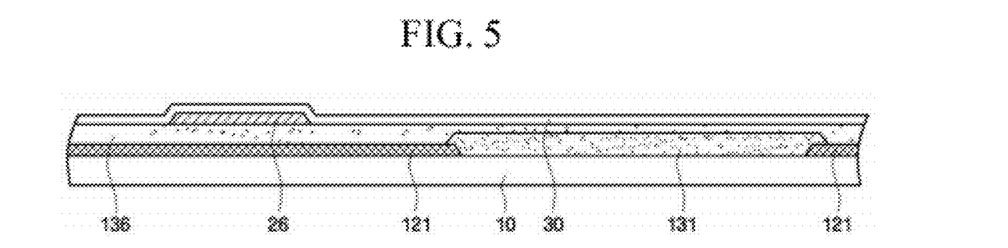

Referring to FIG. 5, a gate insulating layer 30 made of silicon nitride (SiNx) or silicon oxide is formed on the insulating substrate 10 and the gate wire using a chemical vapor deposition method or a sputtering method.

Figure 6:
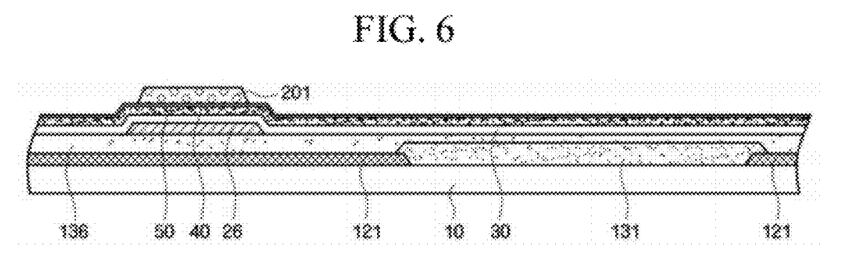

Referring now to FIG. 6, an active layer 40 is formed on the gate insulating layer 30 by depositing hydrogenated amorphous silicon or polycrystalline silicon on the gate insulating layer 30, for example, using a chemical vapor deposition method or a sputtering method. Thereafter, an ohmic layer 50 is formed on the active layer 40 by depositing silicide or n+ hydrogenated amorphous silicon doped with high-density n-type impurities on the active layer 40, for example, using a chemical vapor deposition method or a sputtering method.

Then, the photoresist pattern 201 is formed on the active layer 40 and the ohmic layer 50, and the active layer 40 and the ohmic layer 50 are patterned using the photoresist pattern 201 as an etching mask. Accordingly, an active layer pattern 44 (FIG. 7) and an ohmic layer pattern 54 (FIG. 7) are formed. The term "active" in the active layer pattern 44 means an active material, which has the electric characteristic when drive current is applied thereto and includes a semiconductor, a metal oxide, and the like.

Figure 7:
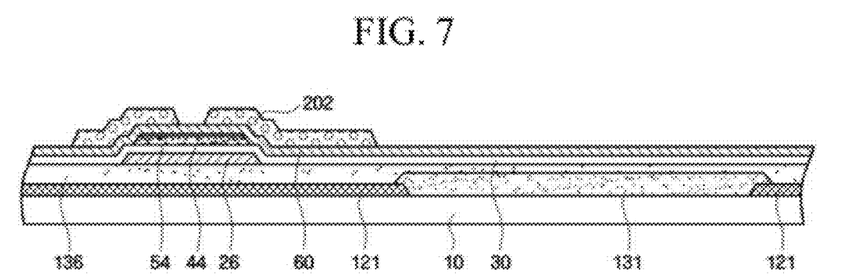

The etching method used to form the active layer pattern 44 and the ohmic layer pattern 54 may be a wet etch or a dry etch. In the case of the wet etch, an etching solution, which is obtained by mixing demineralized water with one of hydrofluoric acid, sulfuric acid, hydrochloric acid, and their combination, may be used. In the case of the dry etch, fluoric etching gas, such as $CHF_3$, $CF_4$, and the like, may be used. Specifically, the fluoric etching gas containing Ar or He may be used as the etching gas.

Figure 8:
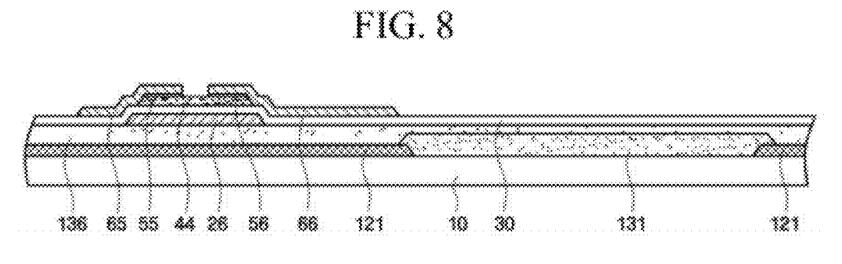

Referring now to FIGS. 7 and 8, a conductive film 60 for the data wire, which is a single layer or a multilayer composed of Ni, Co, Ti, Ag, Cu, Mo, Al, Be, Nb, Au, Fe, Se, or Ta, is deposited using a chemical vapor deposition method or a sputtering method. The multilayer may be a double layer, such as Ti/Al, Ta/Al, Ni/Al, Co/Al, Mo (Mo alloy)/Cu, and the like, or a triple layer, such as Ti/Al/Ti, Ta/Al/Ta, Ti/Al/TiN, Ta/Al/TaN, Ni/Al/Ni, Co/Al/Co, and the like. Then, the photoresist pattern 202 is formed on the conductive film 60, and the conductive film 60 is etched using the photoresist pattern 202 as an etching mask to form data wires 62, 65, and 66. In etching the conductive film 60, a wet etching or a dry etching may be used. In the case of the wet etching, mixed solution of phosphate, nitric acid, and acetic acid, or a mixed solution of hydrofluoric acid and deionized water may be used as the etching solution. In this case, the ohmic layer pattern 54 is etched and separated using the photoresist pattern 202 for etching the conductive film 60 for the data wire. Accordingly, ohmic contact layer patterns 55 and 56 are formed so that the source electrode 65 and the drain electrode 66 overlap each other.

By the above-described etching, the data wires 62, 65, and 66 include the data line 62 formed in a vertical direction and crossing the gate line 22 to define a pixel, the source electrode 65 branching from the data line 62 and extending up to an upper part of the active layer pattern 44, and the drain electrode 66 formed on an upper part of the active layer pattern 44 to be separated from the source electrode 65 and to face the source electrode 65 around the gate electrode 26 or a channel part of the thin film transistor as a center.

Figure 9:
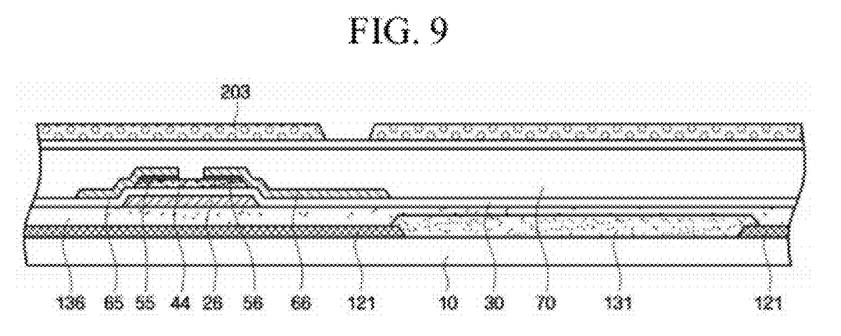

Referring to FIG. 9, a passivation layer 70 is formed on the active layer pattern 4 and the data wires 62, 65, 66, and 67. Then, the photoresist pattern 203 is formed on the passivation layer 70, and a contact hole 76 for exposing the drain electrode 66 is formed through an etching process using the photoresist pattern 203.

Figure 10:
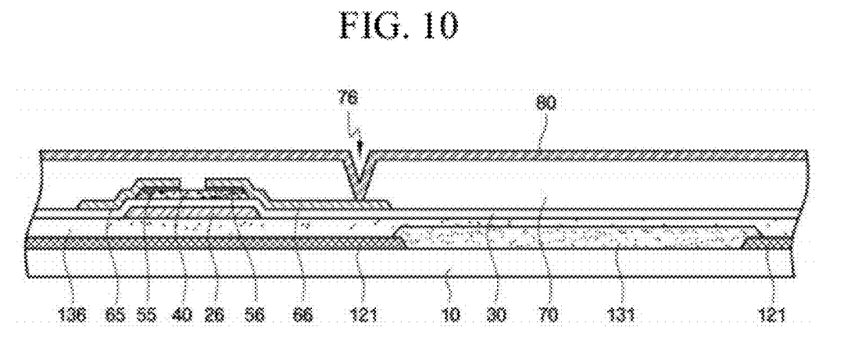

Referring to FIG. 10, a conductive film 80 for the pixel electrode composed of a transparent conductive material, such as ITO or IZO, or a reflective conductive material is formed. The conductive film 80 for the pixel electrode may be deposited using a sputtering method.

Then, referring to FIG. 11, a negative photoresist composition is spread on the conductive layer 80 for the pixel electrode using a spray method, a roll coater method, a spin coating method, and the like.

Then, a solvent contained in the spread negative photoresist composition is removed by free-baking the negative photoresist composition for 2-7 minutes at a temperature of 110-130° C., and thus a photoresist film is formed. Then, light, such as visible ray, ultraviolet (UV) ray, deep UV ray, electron ray, X-ray, and the like, is irradiated onto the photoresist film so that the photoresist film has a specified pattern. Accordingly, the photoresist film in a region where the light has been irradiated forms cross links and is hardened. Then, a post exposure baking (PEB) is performed before the photoresist film is developed. The PEB is performed for 100-200 seconds at a temperature of 130-140° C.

Then, parts except for the pattern are removed by developing the photoresist film using an alkali developing solution. In this case, the developing solution is an alkali aqueous solution, such as an aqueous solution of inorganic alkalis, such as sodium hydroxide, potassium hydroxide, sodium carbonate, and the like; primary amines, such as ethylamine, n-propylamine, and the like; secondary amines, such as diethylamine, n-propylamine, and the like; tertiary amines, such as trimethylamine, methyldiethylamine, dimethylethylamine, triethylamine, and the like; alcohol amines, such as dimethylethanolamine, methyldiethanolamine, triethanolamine, and the like; or quaternary ammonium salt, such as tetramethylammonium hydroxide, tetraethylammonium hydroxide, and the like. The developing solution may be made by dissolving alkaline compound with a density of 0.1-10 parts by weight, and a proper amount of aqueous organic solvent, such as methanol, ethanol, and the like, and surfactant may be added thereto.

Then, referring to FIG. 11, unnecessary parts are completely removed by cleaning the photoresist film with ultra-pure water for 30-90 seconds, and the remaining photoresist film is dried to form an etch pattern 204. After irradiating light such as UV ray onto the etch pattern 204, the pattern is heated for 1-30 minutes at a temperature of 100-250° C. by a heating device such as an oven.

The negative photoresist composition used to fabricate the thin film transistor substrate according to an embodiment of the present invention includes 10-50 parts by weight of novolak resin containing a hydroxyl group that is soluble in an alkali developing solution, 0.5-10 parts by weight of a first photo acid generator represented by the following formula (1), 0.5-10 parts by weight of a second photo acid generator represented by the following formula (2), 1-20 parts by weight of a cross-linking agent, and 10-90 parts by weight of a solvent:

(1)

(2)

Details of the negative photoresist composition will be described later.

The spreading thickness dl of the etch pattern 204 having the above-described composition may be 1-2 μm. If the spreading thickness dl of the etch pattern 204 exceeds 2 μm, the exposure dose and the development time may be increased, and thus the pattern shape may have a reverse taper. If the spreading thickness dl of the etch pattern 204 is less than 1 μm, regions where no photoresist composition is spread may be produced to cause the patterning inferiority. In the case of forming the photoresist film using the positive photoresist composition rather than the negative photoresist composition according to the embodiments of the present invention, many regions where the spreading thickness exceeds 5 μm are produced to make the pattern shape non-uniform.

Then, referring to FIGS. 2 and 3, pixel electrode patterns 84 and 85 are formed by etching the conductive film 80 for the pixel electrode using the etch pattern 204 as an etching mask.

If the negative photoresist composition according to the embodiment of the present invention is used, the heat resistance and development performance of the photoresist film are improved, and thus the pixel electrode patterns 84 and 85 including the fine electrodes 84 can be formed.

After the pixel electrode patterns 84 and 85 are formed, the etch pattern 204 is removed using a stripper. Accordingly, the thin film transistor substrate according to the first embodiment of the present invention is completed.

Hereinafter, the negative photoresist composition according to the second embodiment of the present invention will be further described.

The negative photoresist composition according to the second embodiment of the present invention includes 10-50 parts by weight of novolak resin containing a hydroxyl group that is soluble in an alkali developing solution, 0.5-10 parts by weight of a first photo acid generator represented by the following formula (1), 0.5-10 parts by weight of a second photo acid generator represented by the following formula (2), 1-20 parts by weight of a cross-linking agent, and 10-90 parts by weight of a solvent:

(1)

(2)

The novolak resin having solubility in the alkali developing solution is soluble in an alkali solution such as an aqueous alkali developing solution, but is insoluble in water. The novolak resin can form cross links in the presence of a cross-linking agent. After the cross linking, novolak resin becomes insoluble in an alkali medium, and thus the cross-linked regions are not removed by the alkali developing solution.

The novolak resin can be obtained by reacting phenols with aldehydes or ketones in the presence of an acid catalyst.

The phenols may be at least one selected from the group consisting of phenol, ortho-cresol, meta-cresol, para-cresol, 2,3-dimethylphenol, 3,4-dimethylphenol, 3,5-dimethylphenol, 2,4-dimethyphenol, 2,6-dimethylphenol, 2,3,6-trimethylphenol, 2-t-butylphenol, 3-t-butylphenol, 4-t-buthlphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, and isothymol.

The aldehydes may be at least one selected from the group consisting of formaldehyde, formalin, paraformaldehyde, trioxane, acetaldehyde, propylaldehyde, benzaldehyde, phenylacetaldehyde, a-phenylpropylaldehyde, B-phenylpropylaldehyde, O-hydroxybenzaldehyde, m-hydroxybenzaldehyde, p-hydroxybenzaldehyde, O-chlorobenzaldehide, m-chlorobenzaldehyde, p-chlorobenzaldehyde, O-methylbenzaldehyde, m-methylbenzaldehyde, p-methylbenzaldehyde, p-ethylbenzaldehyde, p-n-buthylaldehyde, and terephthalicaldehyde.

The ketones may be at least one selected from the group consisting of acetone, methylethylketone, diethylketone, and diphenylketone.

The novolak resin may be obtained by condensation-reacting phenols, in which meta-cresol and para-cresol are mixed with a mixing ratio of 30:70 to 60:40, with aldehyde or ketone. The novolak resin obtained as above facilitates the control of the sensitivity of the negative photoresist.

The monodispersed polystyrene conversion weight-average molecular weight of the novolak resin measured by GPC (Gel Permeation Chromatography) may be 1,000-10,000, and preferably 2,000-8,000. If the weight-average molecular weight of the novolak resin is less than 1,000, the increased effect of the molecular weight becomes small even if the cross-linking reaction occurs in the exposed region, and thus the novolak resin is easily dissolved in the alkali developing solution. If the weight-average molecular weight of the novolak resin exceeds 10,000, the difference in solubility between the exposed region and the unexposed region in the alkali developing solution becomes small, and thus it may be difficult to obtain good photoresist patterns.

The negative photoresist composition according to the present invention includes 10-50 parts by weight of novolak resin.

If the content of the novolak resin is less than 10 parts by weight, the viscosity of the negative photoresist composition becomes too low, and thus it is difficult to form the photoresist film having a desired thickness. In this case, the photoresist film cannot be used for slit coating. If the contest of the novolak resin exceeds 50 parts by weight, the viscosity of the negative photoresist composition becomes too high, and thus it is difficult to perform the spin coating with the photoresist film having a uniform thickness.

The first and second photo acid generators included in the negative photoresist composition according to the embodiment of the present invention are compounds that form acid so that the novolak resin can be cross-linked when it is exposed to an active light. The first photo acid generator is a compound represented by the formula (1), and has a superior heat-resistance. The second photo acid generator is a compound represented by the formula (2), and has a high transmittance and a high sensitivity.

If the content of the first photo acid generator is less than 0.5 parts by weight, the heat resistance becomes low, and thus the photoresist pattern may be lost during the PEB process. If the content of the first photo acid generator exceeds 10 parts by weight, the heat resistance becomes high, and thus the PEB margin becomes inferior. In this case, the profile of the photoresist pattern may have a reverse taper.

If the content of the second photo acid generator is less than 0.5 parts by weight, the sensitivity is greatly lowered, and thus the exposure energy may be excessively used while the pattern is formed. If the content of the second photo acid generator exceeds 10 parts by weight, the sensitivity is greatly heightened, and thus the exposure margin and the development performance are lowered.

In the negative photoresist composition according to the embodiment of the present invention, the cross-linking agent cross-links the novolak resin in the presence of the acid. The acid is formed by exposing the first and second photo acid generators. The cross-linking agent serves to change the solubility of the novolak resin in the exposed regionnovolak resin so that the novolak resin is insoluble in the alkali developing solution, and to form the pattern of the novolak resin by the acid generated by the exposing process.

The cross-linking agent may be at least one selected from the group consisting of alkoxymethylation amino resin, alkyletherification melamine resin, benzoguanamine resion, alkyletherification benzoguanamine resin, urea resin, alkyletherification urea resin, urethane-formaldehyde resin, resol-type phenolformaldehyde resin, alkyletherification resol-type phenolformaldehyde resin, and epoxy resin. Among them, the alkoxymethylation amino resin may be at least one selected from the group consisting of alkoxymethylation urea resin, alkoxymethylation melamine resin, alkoxymethylation uron resin alkoxymethylation glycoluril resin, methoxymethylation amino resin, ethoxymethylation amino resin, n-buthoxymethylation amino and hexamethoxymethylmelamine resin. Particularly, in consideration of the resolution, it is advantageous to select the methoxymethylation amino resin, such as hexamethoxymethylmelamine resin, and the like, as the cross-linking agent.

The negative photoresist composition according to the embodiment of the present invention includes 0.1-20 parts by weight of cross-linking agent. If the content of the cross-linking agent is less than 0.1 parts by weight, it is difficult that the cross-linking reaction occurs sufficiently, and thus the remaining rate of the photoresist pattern in the developing solution using the alkali developing solution is greatly lowered, or deformation such as swelling of the photoresist pattern occurs. If the content of the cross-linking agent exceeds 10 parts by weight, the resolution and the PEB margin may deteriorate. In this case, the peeling resistance against the insulating substrate is greatly heightened to cause problems in the etching process.

In order to improve the heat resistance of the photoresist pattern, it is advantageous to set the mixing ratio of the first and second photo acid generators and the cross-linking agent to 1:2 through 1:20. Since the mixing ratio of both parties is within the range, the photoresist pattern has good resolution, heat resistance, and peeling resistance.

The negative photoresist composition according to the embodiment of the present invention may further include a diffusion depressant. The diffusion depressant may be added for the purpose of preventing the diffusion of acid and securing the linearity and uniformity of the photoresist pattern. The diffusion depressant may be at least one selected from the group consisting of tetrabutylammonium hydroxide, triethanolamine, diethanolamine, trioctylamine, n-octylamine, trimethylsulfonium hydroxide, and triphenylsulfonium hydroxide.

The solvent used in the negative photoresist composition according to the embodiment of the present invention forms a uniform pattern profile by providing evenness and preventing the occurrence of coating stain.

The solvent may be alcohols, such as methanol, ethanol, and the like; ethers, such as tetrahydropuran, and the like; glycol ethers, such as ethylene glycol monomethyl ether, ethylene glycol monoethyl ether, and the like; ethylene glycol alkylether acetates, such as methyl cellosolve acetate, ethyl cellosolve acetate, and the like; diethylene glycols, such as diethylene glycol monomethyl ether, diethylene glycol monoethyl ether, diethylene glycol dimethyl ether, and the like; propylene glycol monoalkyl ethers, such as propylene glycol methyl ether, propylene glycol ethyl ether, propylene glycol propyl ether, propylene glycol buthyl ether, and the like; propylene glycol alkyl ether acetates, such as propylene glycol methyl ether acetate, propylene glycol ethyl ether acetate, propylene glycol propyl ether acetate, propylene glycol buthyl ether acetate, and the like; propylene glycol alkyl ether acetates, such as propylene glycol methyl ether propionate, propylene glycol ethyl ether propionate, propylene glycol propyl ether propionate, propylene glycol buthyl ether propionate, and the like; aromatic hydrocarbons, such as toluene, xylene, and the like; and ketones, such as methylethylketone, cyclohexanone, 4-hydroxy-4-methyl-2-pentanone, and the like.

From the viewpoint of the solubility, reaction performance with respective ingredients of the photoresist composition, and easiness of forming the spread layer, it is preferable that the solvent is at least one selected from the group consisting of propyleneglycolmethyletheracetate, ethyllactate, 2-methoxyethylacetate, and propyleneglycolmonomethylether. Also, the negative photoresist composition according to the present invention may include 10-90 parts by weight of the solvent.

As needed, the negative photoresist composition having the above-described ingredients according to the present invention may selectively include sensitizer, surfactant, or adhesion promoter.

Hereinafter, with reference to the following experimental examples, characteristics of the conductive layer pattern and the negative photoresist composition of the thin film transistor substrate fabricated according to the present invention will be described. However, the following experimental examples are merely exemplary, and the present invention is not limited thereto.

EXAMPLE

A negative photoresist composition was prepared by adding a mixture of 5 parts by weight of hexamethoxy melamine (Cymel-370) as a cross-linking agent, 2 parts by weight of a first photo acid generator (CGI-NIT), which is a compound of formula (1), 1.5 parts by weight of a second photo acid generator (PAG-108), which is a compound of formula (2), 1 part by weight of trioctylamine as a diffusion depressant, and 400 parts by weight of propyleneglycolmethyletherpropionate as a solvent, to 100 parts by weight of novolak resin, in which 30 parts by weight of novolak resin having weight-average molecular weight of 4000, being obtained by dehydration with formaldehyde in use of m-cresol and p-cresol at a mixing ratio of 40/60, and 70 parts by weight of novolak resin having weight-average molecular weight of 6000 in use of m-cresol and p-cresol at a mixing ratio of 60/40 are added together.

Comparative Example 1

A negative photoresist composition was prepared in the same method as Example, except that 3.5 parts by weight of the second photo acid generator (PAG-108), which is a compound of formula (2), were independently used as the photo acid generator.

Comparative Example 2

A negative photoresist composition was prepared in the same method as Example, except that 3.5 parts by weight of the first photo acid generator (CGI-NIT), which is a compound of formula (1), were independently used as the photo acid generator.

Comparative Example 3

A negative photoresist composition was prepared in the same method as Example, except that 3.5 parts by weight of halogen-containing triazine (STR-1710) were used as the photo acid generator.

Experiment

1) Sensitivity Measurement

The sensitivity was measured by measuring energy required to form the pattern after pre-baking the substrate coated with the negative photoresist composition, generating the acid of the photo acid generators through reaction with light energy, and performing PEB in order. As the sensitivity value becomes smaller, less light energy is required to form the photoresist pattern. Also, smaller sensitivity value represents higher sensitivity.

2) Pattern Profile Observation

Before performing hard baking after forming the photoresist pattern through PEB, it was observed whether the pattern profile had a forward taper or a reverse taper.

3) Heat Resistance Estimation

The photoresist pattern having a taper angle of substantially 90 degrees was post-exposure-baked on a hot plate at temperatures of 130° C. and 140° C. for 150 sec. After the PEB, it was estimated whether the photoresist pattern profile was maintained in comparison to the photoresist pattern profile before the PEB.

The results of the experiment are provided in Table 1 below.

TABLE 1

| | Sensitivity (mJ/cm²) | Pattern Profile after Development | Heat Resistance (Angle and Size maintained) |
|---|---|---|---|
| Example | 38 | Forward | Good |
| Comparative Example 1 | 30 | Forward | Inferior |
| Comparative Example 2 | 45 | Reverse | Good |
| Comparative Example 3 | 37 | Reverse | Inferior |

Figure 12A:
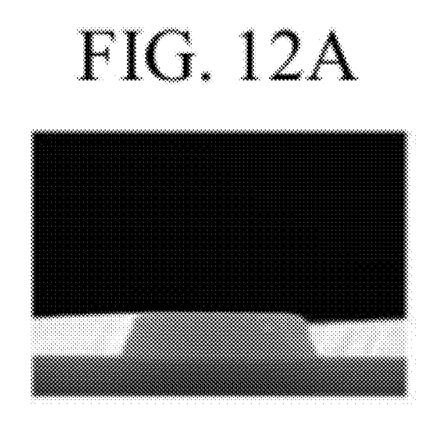
FIGS. 12A to 12C are views illustrating photoresist patterns formed of a photoresist composition according to an embodiment of the present invention.
Figure 12B:
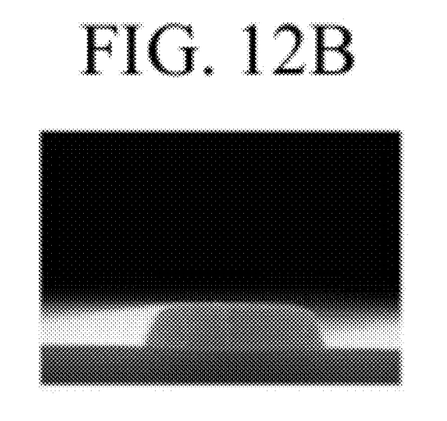
Figure 12C:
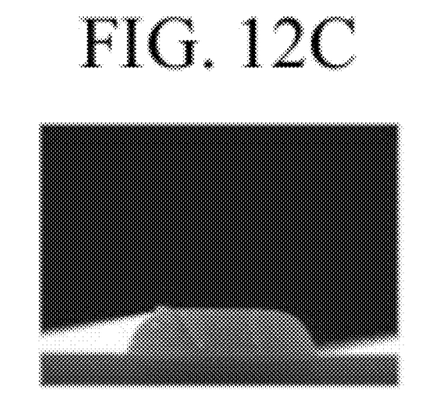
Figure 13A:
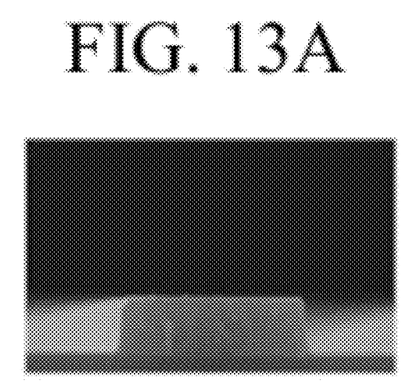
FIGS. 13A to 13C are views illustrating photoresist patterns formed of a photoresist composition according to comparative example 1.
Figure 13B:
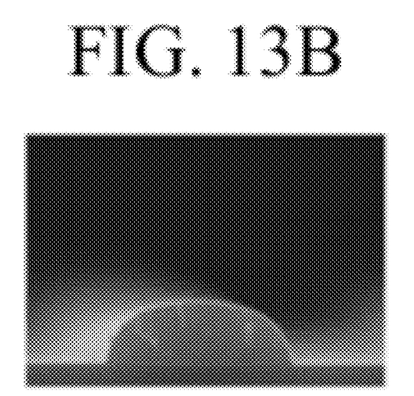
Figure 13C:
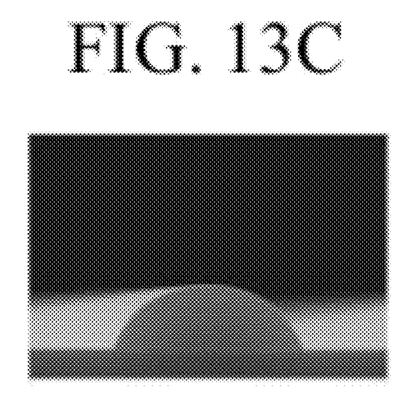
Figure 14A:
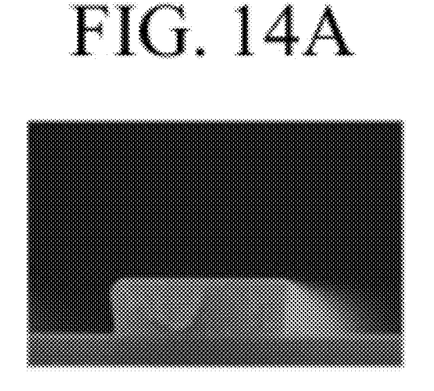
FIGS. 14A to 14C are views illustrating photoresist patterns formed of a photoresist composition according to comparative example 2.
Figure 14B:
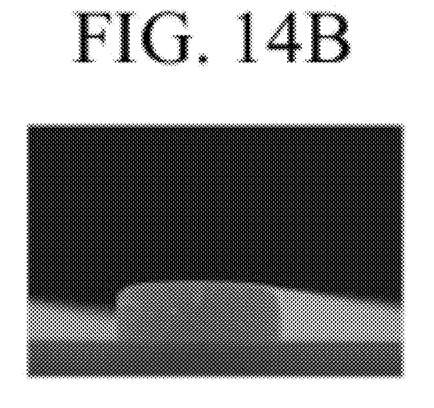
Figure 14C:
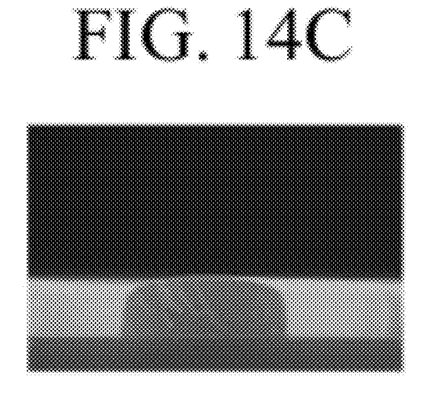
Figure 15A:
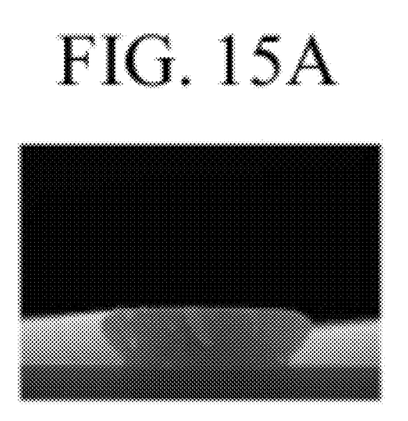
FIGS. 15A to 15C are views illustrating photoresist patterns formed of a photoresist composition according to comparative example 3.
Figure 15B:
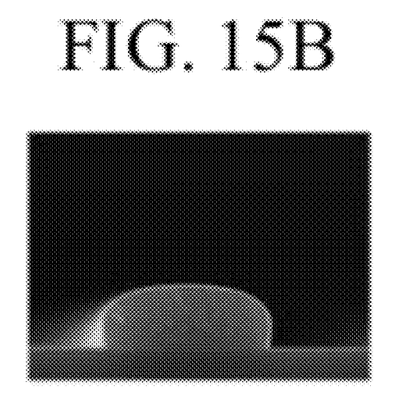
Figure 15C:
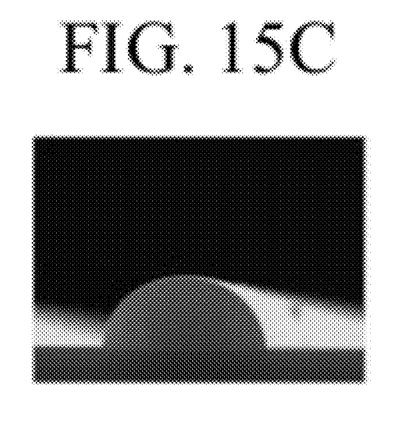

FIGS. 12A to 12C are views illustrating photoresist patterns formed of a photoresist composition according to an embodiment of the present invention. FIGS. 13A to 13C are views illustrating photoresist patterns formed of a photoresist composition according to comparative example 1, FIGS. 14A to 14C are views illustrating photoresist patterns formed of a photoresist composition according to comparative example 2, and FIGS. 15A to 15C are views illustrating photoresist patterns formed of a photoresist composition according to comparative example 3. For reference, FIGS. 12A, 13A, 14A, and 15A show photoresist patterns before PEB is performed. FIGS. 12B, 13B, 14B, and 15B show photoresist patterns after the hard baking is performed at a temperature of 130° C. FIGS. 12C, 13C, 14C, and 15C show photoresist patterns after the hard baking is formed at a temperature of 140° C.

Referring to Table 1 and FIGS. 12A to 12C, the negative photoresist composition according to the second embodiment of the present invention has the sensitivity of 38 mJ/cm², and the photoresist pattern profile after the development has a forward taper. Even after the hard baking process at temperatures of 130° C. and 140° C., the profile and the size of the photoresist pattern are successfully maintained to show a superior heat resistance.

On the other hand, referring to Table 1 and FIGS. 13A to 13C, the negative photoresist composition according to comparative example 1 has an inferior heat resistance since the profile and the size of the photoresist pattern are not maintained after the hard baking process at temperatures of 130° C. and 140° C. Referring to Table 1 and FIGS. 14A to 14C, the photoresist composition according to comparative example 2 has the largest sensitivity value, and the photoresist pattern profile after the development has a reverse taper. Referring to Table 1 and FIGS. 15A to 15C, the photoresist composition according to comparative example 3 has an inferior heat resistance, and the photoresist pattern profile has a reverse taper.

As described above, the negative photoresist composition according to the present invention has the advantages that it has a superior sensitivity and heat resistance, and the photoresist pattern profile has the forward taper. Accordingly, the negative photoresist composition according to the present invention can easily implement high-resolution patterns, and facilitate the formation of micro slit patterns when the liquid crystal display is fabricated.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a thin film transistor substrate, comprising:
   forming a conductive film composed of a conductive material on a substrate;
   forming an etch pattern composed of a negative photoresist composition on the conductive film; and
   forming a conductive film pattern by etching the conductive film using the etch pattern as an etching mask;
   wherein the negative photoresist composition includes 10-50 parts by weight of novolak resin including a hydroxyl group that is soluble in an alkali developing solution, 0.5-10 parts by weight of a first photo acid generator represented by the following formula (1), 0.5-10 parts by weight of a second photo acid generator represented by the following formula (2), 1-20 parts by weight of a cross-linking agent, and 10-90 parts by weight of a solvent:

(1)

(2)

2. The method of claim 1, wherein a spreading thickness of the etch pattern is 1-2 μm.

3. The method of claim 1, wherein the conductive film pattern is a pixel electrode pattern made of a transparent conductive material.

4. The method of claim 3, wherein the pixel electrode pattern is composed of a plurality of fine electrodes and a plurality of fine slits formed among the fine electrodes.

5. The method of claim 4, wherein a width of the fine slit is 2-5 μm.

6. The method of claim 1, wherein the conductive film pattern is a gate wire or a data wire.

7. A negative photoresist composition, comprising:
   10-50 parts by weight of novolak resin including a hydroxyl group that is soluble in an alkali developing solution;
   0.5-10 parts by weight of a first photo acid generator represented by the following formula (1);
   0.5-10 parts by weight of a second photo acid generator represented by the following formula (2);
   1-20 parts by weight of a cross-linking agent; and
   10-90 parts by weight of a solvent:

(1)

-continued (2)

8. The negative photoresist composition of claim 7, wherein polystyrene conversion weight-average molecular weight of the novolak resin is 1,000 to 10,000.

9. The negative photoresist composition of claim 7, wherein the novolak resin is formed by reacting phenols with aldehydes or ketones.

10. The negative photoresist composition of claim 9, wherein the phenols is at least one selected from the group consisting of phenol, ortho-cresol, meta-cresol, para-cresol, 2,3-dimethylphenol, 3,4-dimethylphenol, 3,5-dimethylphenol, 2,4-dimethyphenol, 2,6-dimethylphenol, 2,3,6-trimethylphenol, 2-t-butylphenol, 3-t-butylphenol, 4-t-buthlphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, and isothymol.

11. The negative photoresist composition of claim 10, wherein, when the novolak resin is formed, a mixing ratio of the meta-cresol and the para-cresol is 30:70 to 60:40.

12. The negative photoresist composition of claim 9, wherein the aldehydes is at least one selected from the group consisting of formaldehyde, formalin, paraformaldehyde, trioxane, acetaldehyde, propylaldehyde, benzaldehyde, phenylacetaldehyde, a-phenylpropylaldehyde, B-phenylpropylaldehyde, O-hydroxybenzaldehyde, m-hydroxybenzaldehyde, p-hydroxybenzaldehyde, O-chlorobenzalhide, m-chlorobenzaldehyde, p-chlorobenzaldehyde, O-methylbenzaldehyde, m-methylbenzaldehyde, p-methylbenzaldehyde, p-ethylbenzaldehyde, p-n-buthylaldehyde, and terephthalicaldehyde.

13. The negative photoresist composition of claim 9, wherein the ketones is at least one selected from the group consisting of acetone, methylethylketone, diethylketone, and diphenylketone.

14. The negative photoresist composition of claim 7, wherein the cross-linking agent is at least one selected from the group consisting of alkoxymethylation amino resin, alkyletherification melamine resin, benzoguanamine resion, alkyletherification benzoguanamine resin, urea resin, alkyletherification urea resin, urethane-formaldehyde resin, resol-type phenolformaldehyde resin, alkyletherification resol-type phenolformaldehyde resin, and epoxy resin.

15. The negative photoresist composition of claim 14, wherein the alkoxymethylation amino resin is at least one selected from the group consisting of alkoxymethylation urea resin, alkoxymethylation melamine resin, alkoxymethylation uron resin alkoxymethylation glycoluril resin, methoxymethylation amino resin, ethoxymethylation amino resin, n-buthoxymethylation amino and hexamethoxymethylmelamine resin.

16. The negative photoresist composition of claim 7, wherein the mixing ratio of the first and second photo acid generators and the cross-linking agent is 1:2 to 1:20.

17. The negative photoresist composition of claim 7, further comprising a diffusion depressant, which is at least one selected from the group consisting of tetrabutylammonium hydroxide, triethanolamine, diethanolamine, trioctylamine, n-octylamine, trimethylsulfonium hydroxide, and triphenylsulfonium hydroxide.

18. The negative photoresist composition of claim 7, wherein the solvent is at least one selected from the group consisting of propyleneglycolmethyletheracetate, ethyllactate, 2-methoxyethylacetate, propyleneglycolmethyletherpropionate and propyleneglycolmonomethylether.

* * * * *